GATE COOLING STRUCTURE FOR FIELD EFFECT TRANSISTORS

Filed Feb. 10, 1967 3 Sheets-Sheet 1

INVENTOR.
HANS G. DILL,
BY
Charles S. Haughey
his ATTORNEY.

July 22, 1969 H. G. DILL 3,457,476

GATE COOLING STRUCTURE FOR FIELD EFFECT TRANSISTORS

Filed Feb. 10, 1967 3 Sheets-Sheet 2

GATE COOLING STRUCTURE FOR FIELD EFFECT TRANSISTORS

Filed Feb. 10, 1967 3 Sheets-Sheet 3

United States Patent Office 3,457,476

Patented July 22, 1969

3,457,476

GATE COOLING STRUCTURE FOR FIELD EFFECT TRANSISTORS

Hans G. Dill, Costa Mesa, Calif., assignor to Hughes Aircraft Company, Culver City, Calif., a corporation of Delaware Continuation-in-part of application Ser. No. 432,192, Feb. 12, 1965. This application Feb. 10, 1967, Ser. No. 615,129

Int. Cl. H011 11/14

U.S. Cl. 317—235 8 Claims

ABSTRACT OF THE DISCLOSURE

A semiconductor mounting system having an active field effect transistor device crystal bonded by an electrically and heat conducting metal gate to an electrically insulating, high heat conducting ceramic which serves as an insulating mounting member and as a heat sink.

This is a continuation-in-part of application Ser. No. 432,192 filed Feb. 12, 1965, now abandoned.

This invention involves a mounting system for field effect semiconductor devices in which a metal gate contact, adjacent the active semiconductor volume wherein heat is generated, is bonded to a highly heat conductive ceramic such as aluminum oxide (such as sapphire), beryllia, or oxide coated metals such as anodized or oxide coated molybdenum, tantalum or tungsten, which heat conductive ceramic serves as a heat sink while electrically insulating the circuit.

For further consideration of what I believe to be novel and my invention, attention is directed to the following description, and appended claims, and the drawings, in which:

This invention will be illustrated as applied to a metal oxide semiconductor field effect transistor in which a large gate overlies the active device area in which heat is primarily generated, and the gate is in turn bonded to a heat conducting electrically insulating mount which serves as a heat sink. Some details of construction of the illustrative device, such as are known in the art, are omitted for clarity of illustration, and proportions shown have been in some cases exaggerated for the same purpose.

Metal-oxide-semiconductor field effect transistor devices are quite promising for use in electronic circuits because simple and effective linear or switching circuitry can be provided from a wide selection of P channel and N channel enhancement or depletion devices. Pentode, or triode-like, voltage-current characteristics can be obtained from such devices. High input impedance characteristics of these devices gives the circuit designer, especially in the low frequency range, more freedom than with ordinary transistors. Furthermore, the low temperature-sensitivity of these devices reduces the necessary circuit compensation and they are easily fabricated for use as discrete, and especially for use as integrated, devices. In addition, these devices lend themselves to a large number of device configurations.

The enhancement metal-oxide-semiconductor field effect transistor generally is operated in the normal mode, or forward mode. The use of these devices in the forward pinch-off mode is very popular because of the constant current-voltage characteristic which is similar to that of a vacuum tube pentode.

Figure 1:
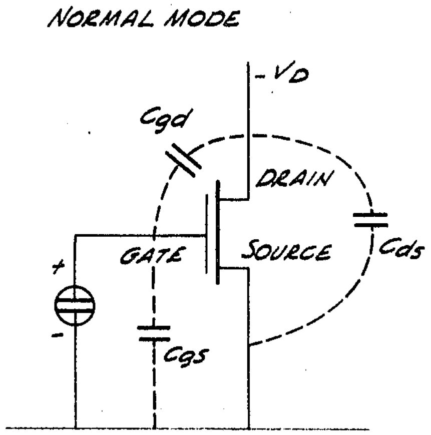
FIG. 1 is a schematic circuit diagram showing the forward biasing arrangement of a metal-oxide-semiconductor field effect transistor operated in the normal mode.
Figure 3:
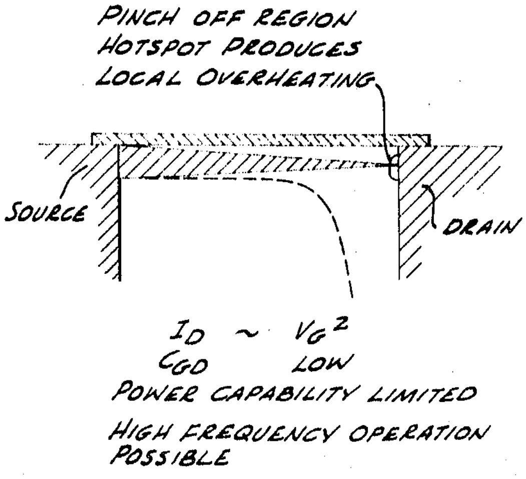
FIG. 3 is a diagram showing the characteristic behavior in the channel region of a metal-oxide-semiconductor field effect transistor operated in the normal mode.
Figure 2:
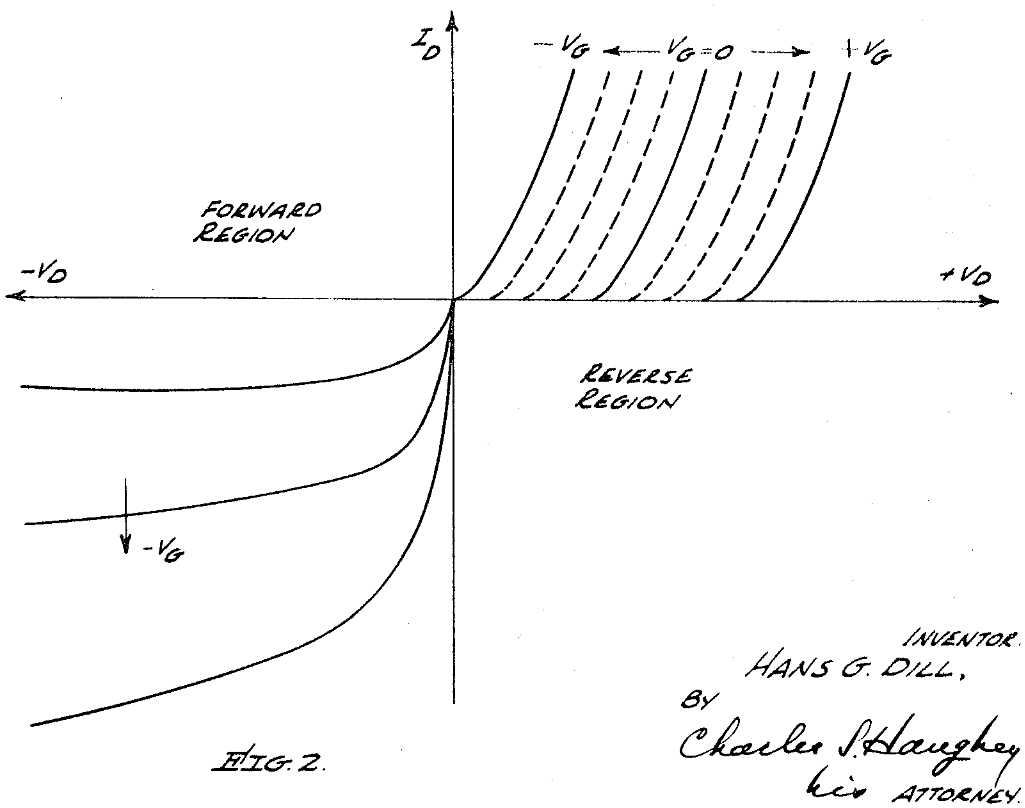
FIG. 2 is a voltage-current diagram for the normal mode operation of FIG. 1.

It will be seen that in the normal mode operation illustrated in FIGS. 1 to 3, at saturation ($V_D > V_G$) a current limited $V_D - I_D$ pentode characteristic is created by the channel pinch-off effect near the drain electrode. This effect shields the drain from the gate (low $C_{GD}$) and the source, and this effect is responsible for most of the power dissipation taking place in the small pinch-off region. As a result the metal-oxide-semiconductor field effect transistor, when operated in the normal mode, is normally designed for a relatively low power operation due to the local overheating, resulting in a hot spot, in the pinch-off region. It can also be operated in the reverse mode. The device, when operated in reverse mode, behaves very much like a source follower, displaying a high input impedance, a low output impedance and $\mu > 1$ and can be used as a power amplifier with very good linearity and extreme power capability, as a power switch with "on" and "off" capability, as a constant voltage source or voltage regulator, and the like.

In actual practice it has been found that metal-oxide-semiconductor field effect transistors operated in P channel enhancement mode display superior reverse characteristics. The voltage-current characteristics of a P channel enhancement metal-oxide-semiconductor field effect transistor operated in the reverse mode of the invention is shown on the right side in FIG. 2. The high degree of linearity in the horizontal displacement of the voltage-current curves is very important from a practical standpoint. These characteristics assure the low distortion in power output stages.

A primary object in using the reverse mode metal-oxide-semiconductor of the invention is to provide a device for use at high power dissipation and low drain resistance $R_D$. A large channel width W is desirable for such use. A channel with a large W can be realized to an optimum degree by employing an interdigitated source and drain structure with a total surface overlying gate arrangement as described in my copending patent application Ser. No. 427,264, filed Jan. 22, 1965, now U.S. Patent No. 3,414,781.

A heat sink preferably is attached to the gate, or active, side of the metal-oxide semiconductor field effect transistor.

Figure 4:
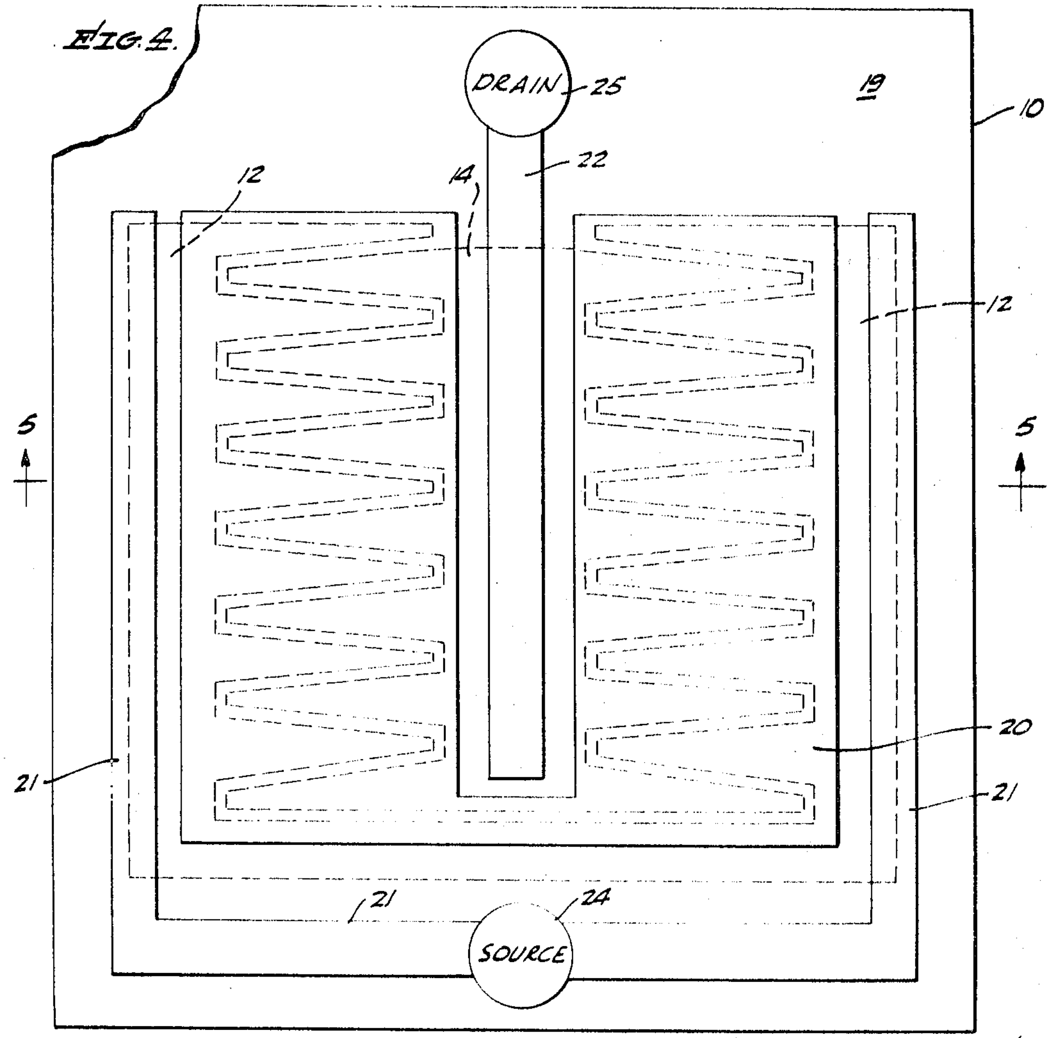
FIG. 4 is a plan view of a metal-oxide-semiconductor field effect transistor with an interdigitated source and drain and a total surface overlying gate arrangement.
Figure 5:
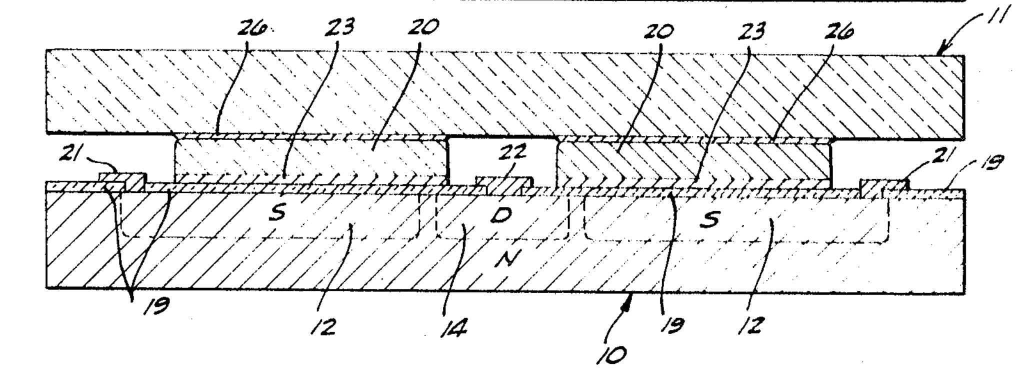
FIG. 5 is a sectional view of the transistor of FIG. 4 shown bonded to a ceramic heat sink support.

In the device as illustrated in FIGS. 4 and 5, the substrate 10 is of silicon, for example, but can be of germanium or other semiconductor material and the heat sink 11 is sapphire (alumina) but can be any electrically insulative, highly heat conductive material such as the heat conductive ceramics alumina and beryllia or heavily anodized or oxide-coated metals such as molybdenum, tantalum or tungsten.

The source regions are shown at 12 and the drain area is shown at 14.

An insulating layer 19 of silicon oxide, considered to be $SiO_2$, covers the entire active device except for longitudinal contact areas of the source and drain; and respective film layers 21, 22 of lead metal, preferably aluminum, overlies the exposed contact ares of the source and drain. A metal gate 23 which may be an aluminum film, is deposited over the broad interdigitated area formed by the source and drain, insulated therefrom by the film 19. The aluminum film 19 is covered by a second film 20 raised substantially from the device surface to present a metal area for future assembly bonding preferably by ultrasonic process to a mount. Portions of the source and drain leads are also raised to substantially the same level to form contact areas 24, 25; alternatively, the raised gate 20 and contact areas 24, 25 may be of silver solder or other suitable bonding metal.

A relatively large heat sink mount 11, preferably of sapphire, is prepared with a bonding metal or aluminum film pattern 26, 27, 28 corresponding to that of the gate, source and drain contact areas, together with extended leads 29, 30, 31 to external lead connection pads 32, 33, 34, suitable for attaching leads to a can with a good heat sink.

Figure 6:
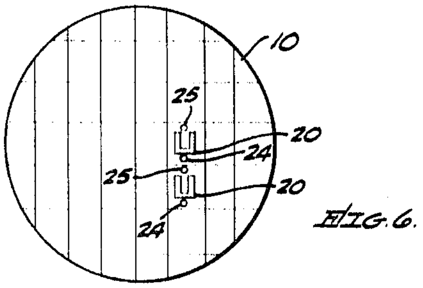
FIG. 6 is a plan view of a silicon slice showing a plurality of transistors of the type illustrated in FIG. 4 as produced on a single slice.
Figure 7:
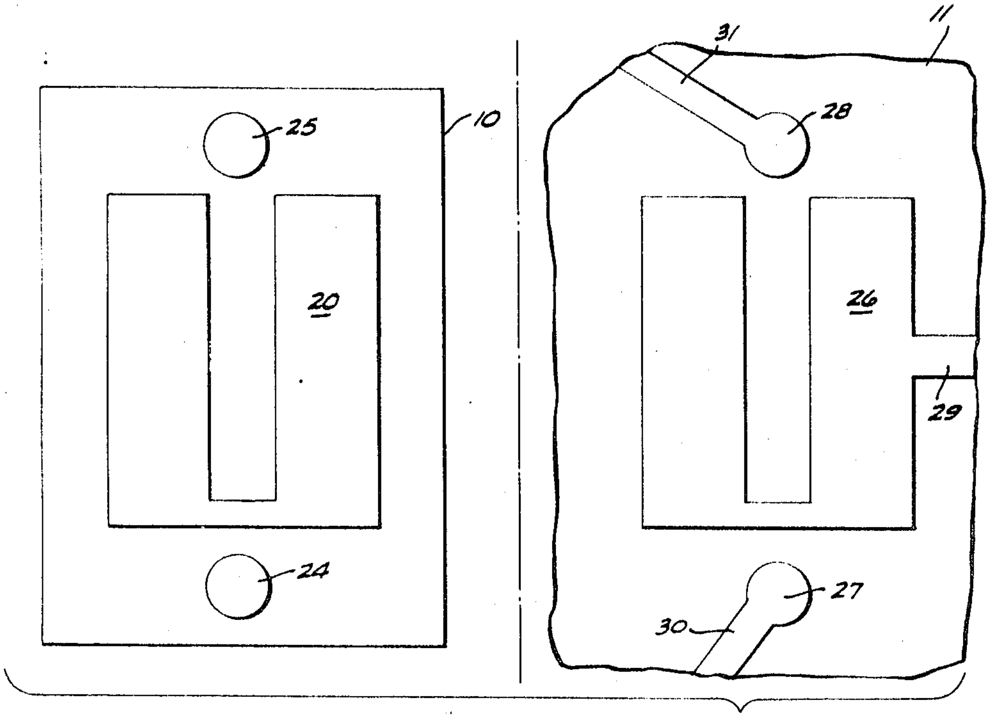
FIG. 7 is a plan view of the transistor of FIG. 4 and a heat sink mount prior to flipping the transistor chip onto the mount.
Figure 8:
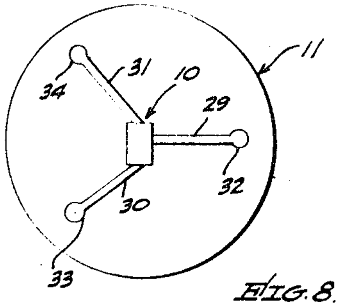
FIG. 8 is a plan view of the metal-oxide-semiconductor transistor chip of FIG. 4 on a ceramic mount as used in a standard heat sink-semiconductor "can" or housing.

Individual device chips 10 are preferably fabricated by integrated circuit techniques to produce a large number of devices on a single silicon slice as shown in FIG. 6. After separation of individual chips, they are assembled onto a prepared mount or heat sink 11 by flipping the chip onto the mount along the axis as shown in FIG. 7. The resulting assembly is shown in FIG. 8 with the small chip or substitute 10 mounted on the mount 11, the connections to the chip being of course on the bottom side of the chip as shown in FIG. 8, where source, drain and gate connections are shown at 34, 33 and 32, respectively.

Obviously many other modifications and variations of the present invention are possible in the light of the above teachings. It is therefore to be understood that within the scope of the appended claims the invention can be practiced otherwise than as specifically described.

What is claimed is:

1. A metal-oxide-semiconductor field effect transistor provided with a heat sink of heat conducting electrical insulating material on the top side of the gate in heat conducting relation to substantial portions thereof.

2. A field effect transistor according to claim 1 and comprising:

(a) a semiconductor crystal of first conductivity type;
(b) first and second crystal source and drain regions, adjacent a surface of the crystal, of second conductivity type and separated by a channel of said first conductivity type;
(c) an electrically insulating layer over the channel;
(d) an electrically conductive gate layer over the channel and insulated therefrom by the insulating layer; and
(e) a heat conductive layer of electrically insulative material adjacent the gate and channel, whereby to act as a heat sink and heat conductor for heat generated in said channel during current flow

3. A transistor according to claim 2 wherein the heat conductive layer overlies the gate and channel.

4. A transistor according to claim 2 wherein the heat conductive layer is of the class consisting of alumina, beryllia, and oxide coated molybdenum, and tungsten.

5. A device according to claim 2 wherein:

(a) the crystal is of P-type electrical conductivity except in the source and drain regions, which regions are of N-type;
(b) the gate layer is of highly heat and electrical conductivity silver solder; and
(c) the heat sink layer is of sapphire.

6. A device according to claim 5 wherein said material is of the class consisting of alumina, beryllia, and oxide coated molybdenum, tantalum and tungsten.

7. A semiconductor device according to claim 1 and having active, current conducting regions adjacent a surface thereof; and (a) a layer of heat conductive, electrically insulative material overlying said active, current conducting regions whereby to act as a heat sink and heat conductor for heat generated by current in said regions.

8. A device according to claim 1 wherein the heat sink serves as a mount for the transistor, and is of substantially larger size than the transistor whereby to absorb and dissipate relatively large amounts of heat generated in the transistor.

References Cited

UNITED STATES PATENTS

| | | | |
|---|---|---|---|
| 3,114,867 | 12/1963 | Szekely | 317—235 |
| 3,254,389 | 6/1966 | Andres et al. | 29—25.3 |
| 3,414,968 | 12/1968 | Genser et al. | 29—577 |
| 2,817,048 | 12/1957 | Thuermel et al. | 317—234 |
| 2,887,628 | 5/1959 | Zierdt | 317—234 |
| 3,241,931 | 3/1966 | Triggs et al. | 29—195 |
| 3,361,868 | 1/1968 | Bachman | 174—52 |
| 3,366,793 | 1/1968 | Svedberg | 250—211 |
| 3,377,513 | 4/1968 | Ashby et al. | 317—101 |

JOHN W. HUCKERT, Primary Examiner

R. SANDLER, Assistant Examiner

U.S. Cl. X.R.

29—571

PO-1050
(5/69)

UNITED STATES PATENT OFFICE
CERTIFICATE OF CORRECTION

Patent No. 3,457,476 Dated 31 July 1969

Inventor(s) HANS G. DILL

It is certified that error appears in the above-identified patent and that said Letters Patent are hereby corrected as shown below:

Column 3, line 3, "ares" is misspelled. Change the spelling to --areas--.
Column 4, claim 4, line 3, after "molybdenum," add --tantalum--.

SIGNED AND SEALED

DEC 2 - 1969

(SEAL)
Attest:

Edward M. Fletcher, Jr.
Attesting Officer

WILLIAM E. SCHUYLER, JR.
Commissioner of Patents